US008208301B2

United States Patent
Kang et al.

(10) Patent No.: US 8,208,301 B2
(45) Date of Patent: *Jun. 26, 2012

(54) NONVOLATILE MEMORY DEVICES HAVING COMMON BIT LINE STRUCTURE

(75) Inventors: Hee-soo Kang, Seoul (KR); Choong-ho Lee, Gyeonggi-do (KR); Yoon-moon Park, Seoul (KR); Dong-hoon Jang, Seoul (KR); Young-bae Yoon, Gyeonggi-do (KR)

(73) Assignee: Samsung Electronics Co., Ltd. (KR)

( * ) Notice: Subject to any disclaimer, the term of this patent is extended or adjusted under 35 U.S.C. 154(b) by 361 days.

This patent is subject to a terminal disclaimer.

(21) Appl. No.: 12/573,239

(22) Filed: Oct. 5, 2009

(65) Prior Publication Data

US 2010/0085812 A1 Apr. 8, 2010

(30) Foreign Application Priority Data

Oct. 8, 2008 (KR) ........................ 10-2008-0098780

(51) Int. Cl.
*G11C 16/04* (2006.01)
(52) U.S. Cl. ......... 365/185.05; 365/185.01; 365/185.12; 365/185.17; 365/185.18
(58) Field of Classification Search ............ 365/185.01, 365/185.05, 185.12, 185.17, 185.18
See application file for complete search history.

(56) References Cited

U.S. PATENT DOCUMENTS

| 5,111,428 | A  | * | 5/1992  | Liang et al. ................ 365/104    |
|-----------|----|---|---------|------------------------------------------|
| 6,151,249 | A  | * | 11/2000 | Shirota et al. ............ 365/185.17   |
| 7,177,191 | B2 | * | 2/2007  | Fasoli et al. ............. 365/185.17   |
| 7,796,432 | B2 | * | 9/2010  | Kim et al. ................ 365/185.17   |
| 2007/0047312 | A1 | * | 3/2007 | Aritome ................... 365/185.17   |
| 2007/0165459 | A1 | * | 7/2007 | Nazarian .................. 365/185.17   |
| 2007/0217263 | A1 | * | 9/2007 | Fasoli et al. ............. 365/185.17   |
| 2008/0186765 | A1 | * | 8/2008 | Kamigaichi ............. 365/185.05      |

FOREIGN PATENT DOCUMENTS

| JP | 2005-056989    | 3/2005 |
|----|----------------|--------|
| KR | 1020070037949 A | 4/2007 |
| KR | 1020080026388 A | 3/2008 |

* cited by examiner

*Primary Examiner* — Pho M Luu
*Assistant Examiner* — Thao Bui
(74) *Attorney, Agent, or Firm* — Myers Bigel Sibley & Sajovec

(57) ABSTRACT

Provided is a nonvolatile memory device having a common bit line structure. The nonvolatile memory device includes multiple unit elements having a NAND cell array structure, arranged in each of multiple memory strings, and each including a control gate and a charge storage layer. Multiple common bit lines are each commonly connected to ends of each of one pair of memory strings among the memory strings. Provided are a first selection transistor having a first driving voltage and multiple second selection transistors connected in series to the first selection transistors and having a second driving voltage that is lower than the first driving voltage. The first selection transistor and the second selection transistors are arranged between the common bit lines and the unit elements of the of memory strings.

20 Claims, 13 Drawing Sheets

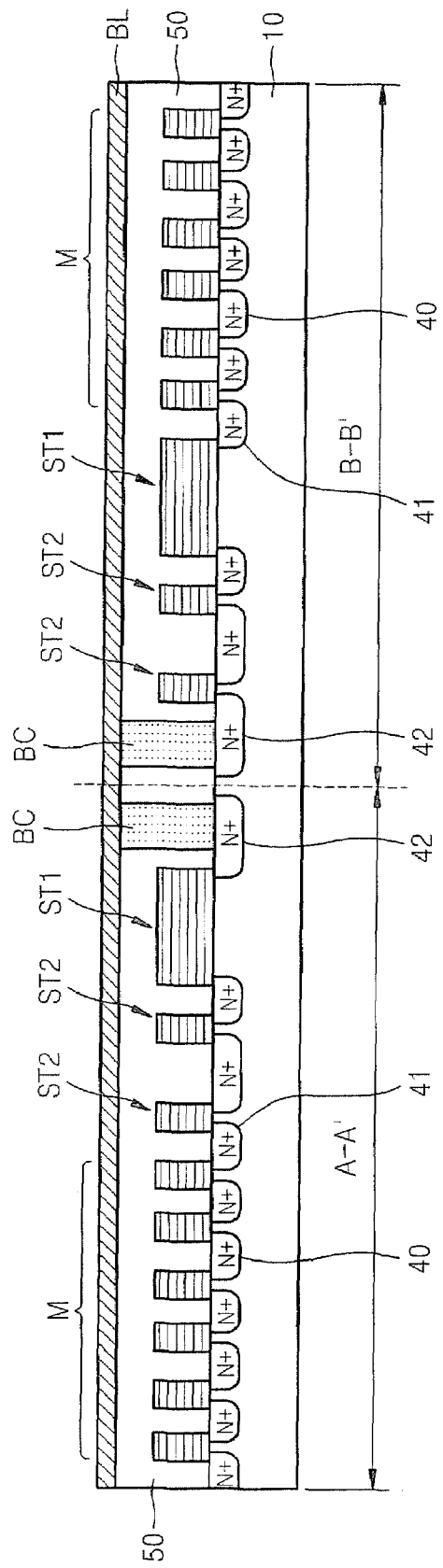

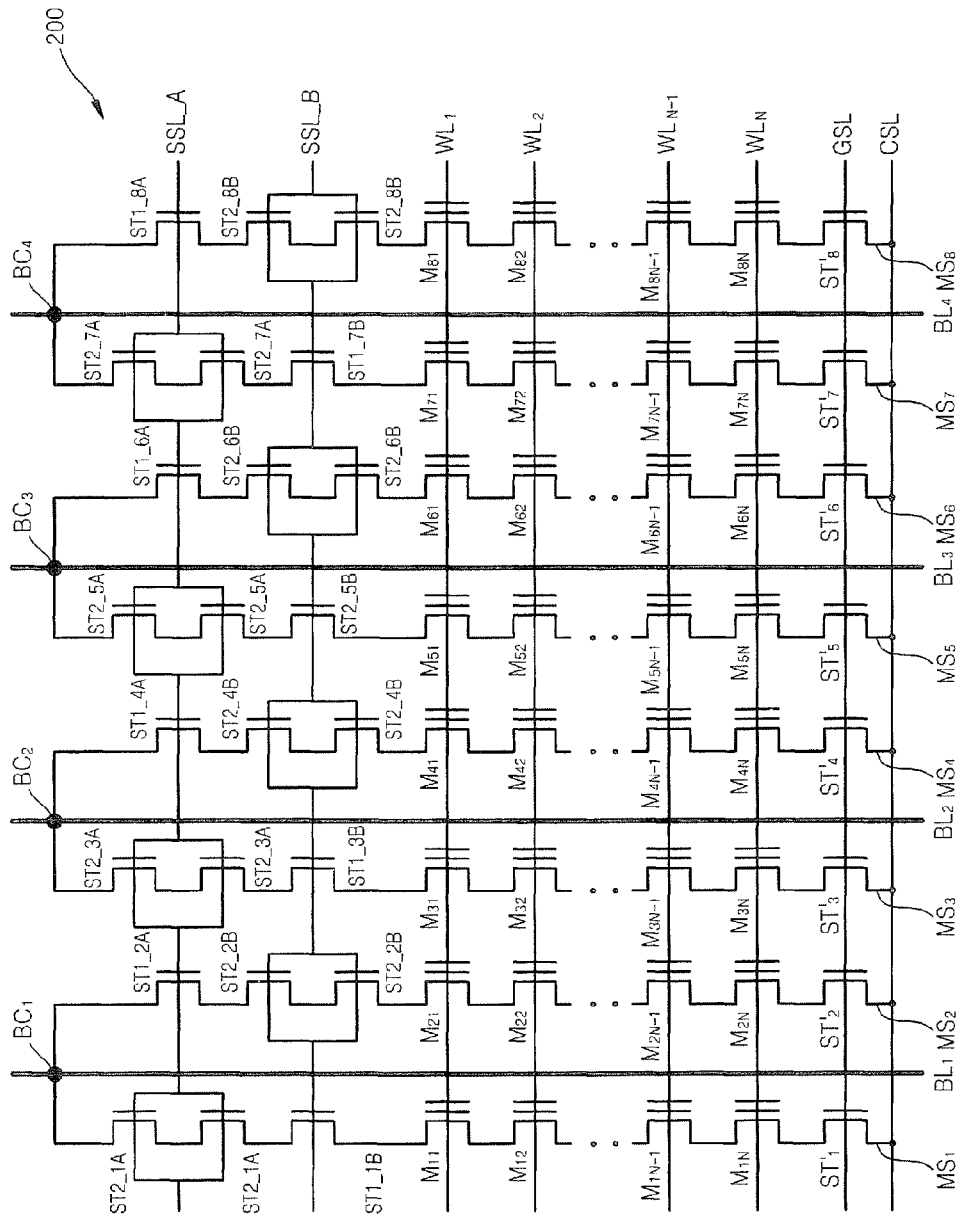

NONVOLATILE MEMORY DEVICES HAVING COMMON BIT LINE STRUCTURE

CROSS-REFERENCE TO RELATED APPLICATIONS

This application claims the benefit of Korean Patent Application No. 10-2008-0098780, filed on Oct. 8, 2008, in the Korean Intellectual Property Office, the disclosure of which is incorporated herein in its entirety by reference as if set forth fully herein.

BACKGROUND

The inventive concept relates to memory devices, and more particularly, to nonvolatile memory devices.

Semiconductor devices including nonvolatile memory devices may be beneficially smaller and be capable of processing a greater amount of data. Accordingly, such semiconductor nonvolatile memory devices may also include a higher degree of integration. In this regard, nonvolatile memory devices having a structure in which a plurality of memory strings may be smaller and may process data at increasing rates may be beneficial.

SUMMARY

The inventive concept provides nonvolatile memory devices having a structure in which multiple memory strings share a common bit line. Devices according to embodiments of the present include multiple first selection transistors having a first driving voltage and multiple second selection transistors, at least two of which are connected in series with the first selection transistor, and ones of the second selection transistors having a second driving voltage that is lower than the first driving voltage. Devices may include a first memory string that includes a first one of the first selection transistors and a first at least two of the second selection transistors and a second memory string that includes a second one of the first selection transistors and a second at least two of the second selection transistors. A device may include a first string selection line connected to the first one of the first selection transistors or the first at least two of the second selection transistors of the first memory string. A second string selection line may be connected to the second one of the first selection transistors or the second at least two of the second selection transistors of the second memory string. A common bit line commonly connects ends of each of the first memory string and the second memory string.

In some embodiments, the second selection transistors are configured such that two second selection transistors form one pair. Some embodiments provide that ones of the first selection transistors and ones of the at least two second selection transistors are alternately arranged along the first and second string selection lines. In some embodiments, the first and second string selection lines are arranged in different rows.

Some embodiments provide that each of the first and second memory strings further includes multiple unit elements that are connected in series. In some embodiments, each of the unit elements includes a control gate and a charge storage layer. Some embodiments provide that the charge storage layer includes a charge trap layer or a floated conductive layer. In some embodiments, the unit elements are arranged in a NAND configuration.

Some embodiments of the present invention include a nonvolatile memory device having a common bit line structure that includes a first memory string including a first selection transistor having a first driving voltage, multiple second selection transistors connected in series to the first selection transistor and having a second driving voltage that is lower than the first driving voltage, and multiple unit elements each including a control gate and a charge storage layer. A device may include a second memory string including a third selection transistor having the first driving voltage, multiple fourth selection transistors connected in series to the third selection transistor and having the second driving voltage, and multiple unit elements each including a control gate and a charge storage layer. Some embodiments include multiple word lines respectively connected to control gates of the unit elements of the first and second memory strings which are arranged in the same rows, and crossing the first and second memory strings. Devices may include a first string selection line connected to one of the first and second selection transistors of the first memory string, and crossing the first memory string and a second string selection line connected to one of the third and fourth selection transistors of the second memory string, and crossing the second memory string. Devices may include a common bit line commonly connecting ends of each of the first memory string and the second memory string.

In some embodiments, the second selection transistors are configured such that two second selection transistors form one pair and the fourth selection transistors are configured such that two fourth selection transistors form one pair. Some embodiments provide that the first and second selection transistors are alternately arranged along the first and second string selection lines and the third and fourth selection transistors are alternately arranged along the first and second string selection lines. In some embodiments, the first and second string selection lines are arranged in different rows.

Some embodiments provide that the charge storage layer includes a charge trap layer or a floated conductive layer. In some embodiments, the unit elements are arranged in a NAND configuration.

Some embodiments of the present invention include nonvolatile memory devices having a common bit line structure. Embodiments of such devices may include multiple unit elements having a NAND cell array structure, arranged in each of multiple memory strings, and each including a control gate and a charge storage layer. Devices may include multiple common bit lines each commonly connected to ends of each of one pair of memory strings among the memory strings and a first selection transistor having a first driving voltage and a plurality of second selection transistors connected in series to the first selection transistors and having a second driving voltage that is lower than the first driving voltage. The first selection transistor and the second selection transistors are arranged between the common bit lines and the unit elements of the memory strings. A device may include a first string selection line connected to one of the first and second selection transistors of a first memory string of one pair of memory strings connected to one of the common bit lines and a second string selection line connected to one of the first and second selection transistors of a second memory string of one pair of memory strings connected to one of the common bit lines. Devices may include multiple word lines connected to control gates of the unit elements having the NAND cell array structure which are arranged in the same rows.

In some embodiments, the first and second selection transistors included in one pair of memory strings connected to one of the common bit lines are alternately arranged along the first and second string selection lines. Some embodiments provide that the first and second selection transistors included in one pair of memory strings connected to one of the common bit lines are arranged to be respectively symmetric with respect to the first and second selection transistors included in another pair of memory strings connected to an adjacent common bit line.

In some embodiments, the first and second selection transistors are alternately arranged along the first and second string selection lines. Some embodiments provide that the first and second string selection lines are arranged in different rows. In some embodiments, the charge storage layer includes a charge trap layer or a floated conductive layer.

BRIEF DESCRIPTION OF THE DRAWINGS

The accompanying figures are included to provide a further understanding of the present invention, and are incorporated in and constitute a part of this specification. The drawings illustrate some embodiments of the present invention and, together with the description, serve to explain principles of the present invention.

FIGS. 4A through 4I are cross-sectional views for explaining methods of fabricating the nonvolatile memory device of FIG. 2, according to some embodiments of the present invention.

FIG. 5 is a circuit diagram of a nonvolatile memory array according to some embodiments of the present invention.

DETAILED DESCRIPTION

Figure 1:
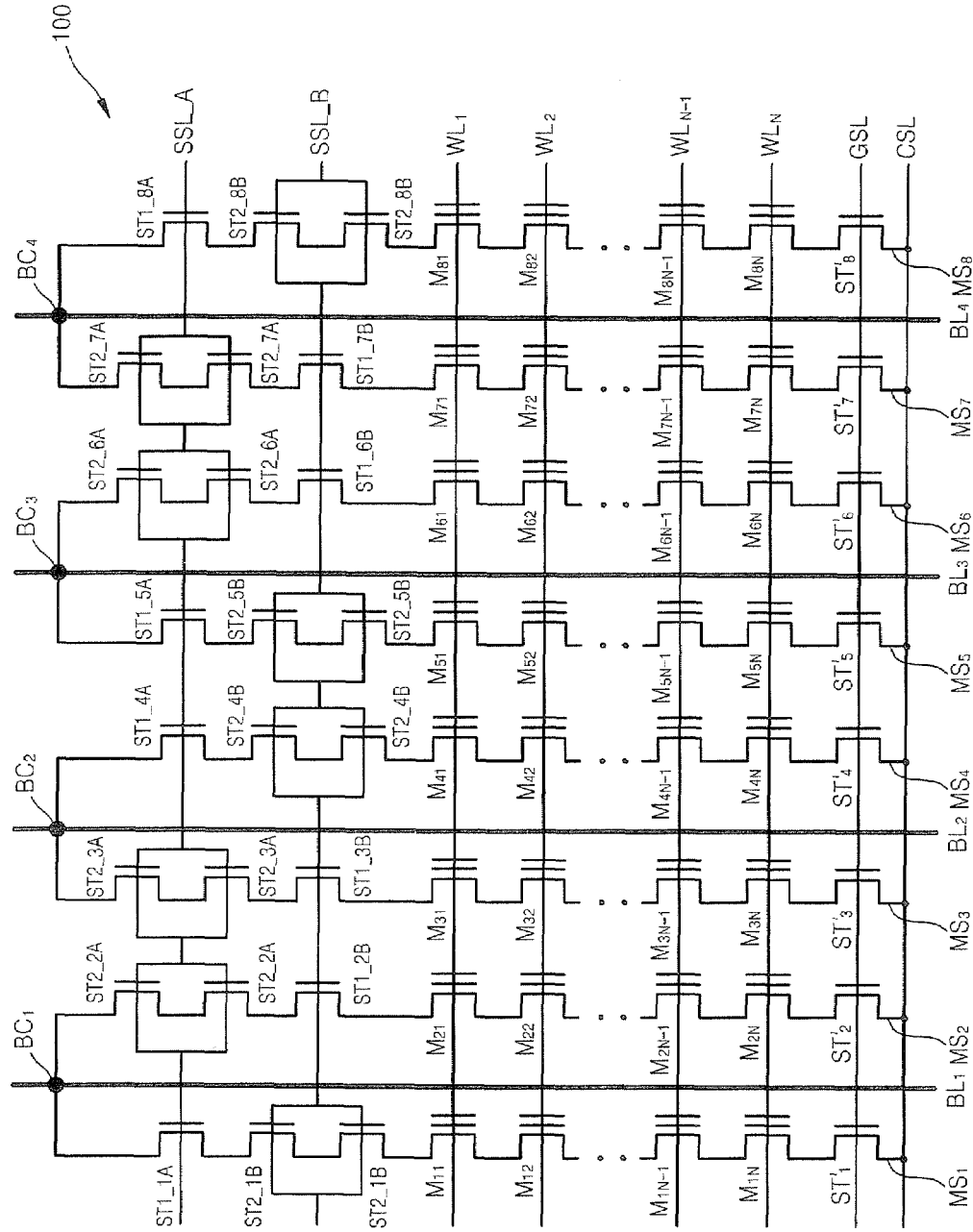
FIG. 1 is a circuit diagram of a nonvolatile memory array according to some embodiments of the present invention.

The present invention now will be described more fully hereinafter with reference to the accompanying drawings, in which embodiments of the invention are shown. However, this invention should not be construed as limited to the embodiments set forth herein. Rather, these embodiments are provided so that this disclosure will be thorough and complete, and will fully convey the scope of the invention to those skilled in the art.

It will be understood that, although the terms first, second, etc. may be used herein to describe various elements, these elements should not be limited by these terms. These terms are only used to distinguish one element from another element. Thus, a first element discussed below could be termed a second element without departing from the scope of the present invention. In addition, as used herein, the singular forms "a", "an" and "the" are intended to include the plural forms as well, unless the context clearly indicates otherwise. It also will be understood that, as used herein, the term "comprising" or "comprises" is open-ended, and includes one or more stated elements, steps and/or functions without precluding one or more unstated elements, steps and/or functions. The term "and/or" includes any and all combinations of one or more of the associated listed items.

It will also be understood that when an element is referred to as being "on", "connected to" or "coupled to" another element, it can be directly on, connected to or coupled to the other element or intervening elements may be present. In contrast, when an element is referred to as being "directly on", "directly connected to" or "directly coupled to" another element, there are no intervening elements present. It will also be understood that the sizes and relative orientations of the illustrated elements are not shown to scale, and in some instances they have been exaggerated for purposes of explanation. Like numbers refer to like elements throughout.

Unless otherwise defined, all terms (including technical and scientific terms) used herein have the same meaning as commonly understood by one of ordinary skill in the art to which this invention belongs. It will be further understood that terms, such as those defined in commonly used dictionaries, should be interpreted as having a meaning that is consistent with their meaning in the context of the relevant art and will not be interpreted in an idealized or overly formal sense unless expressly so defined herein. The present invention will now be described more fully hereinafter with reference to the accompanying drawings, in which preferred embodiments of the invention are shown. This invention, however, may be embodied in many different forms and should not be construed as limited to the embodiments set forth herein. Rather, these embodiments are provided so that this disclosure will be thorough and complete, and will fully convey the scope of the invention to those skilled in the art.

Spatially relative terms, such as "above," "upper," "beneath," "below," "lower," and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the exemplary term "above" may encompass both an orientation of above and below. The device may be otherwise oriented (rotated 90 degrees or at other orientations) and spatially relative descriptors used herein interpreted accordingly.

Reference numerals are indicated in detail in some embodiments of the present invention, and their examples are represented in reference drawings. Throughout the drawings, like reference numerals are used for referring to the same or similar elements in the description and drawings.

Example embodiments are described herein with reference to cross-sectional illustrations that are schematic illustrations of example embodiments (and intermediate structures). As such, variations from the shapes of the illustrations as a result, for example, of manufacturing techniques and/or tolerances, are to be expected. Thus, example embodiments should not be construed as limited to the particular shapes of regions illustrated herein but may be to include deviations in shapes that result, for example, from manufacturing. For example, an implanted region illustrated as a rectangle may, typically, have rounded or curved features and/or a gradient of implant concentration at its edges rather than a binary change from implanted to non-implanted region. Likewise, a buried region formed by implantation may result in some implantation in the region between the buried region and the surface through which the implantation takes place. Thus, the regions illustrated in the figures are schematic in nature and their shapes may be not intended to illustrate the actual shape of a region of a device and are not intended to limit the scope of example embodiments.

Hereinafter, the exemplary embodiments of the inventive concept will be described in detail with reference to the accompanying drawings. In the drawings, variations from the shapes of the illustrations as a result, for example, of manufacturing techniques and/or tolerances, are to be expected. Thus, the example embodiments should not be construed as limited to the particular shapes of regions illustrated herein but may be to include deviations in shapes that result, for example, from manufacturing.

Reference is now made to FIG. 1, which is a circuit diagram of a nonvolatile memory array 100 according to some embodiments of the present invention. For example, the nonvolatile memory array 100 may be a NAND-type nonvolatile memory array. The nonvolatile memory array 100 may include a plurality of memory strings $MS_1$ through $MS_8$. Each of the plurality of memory strings $MS_1$ through $MS_8$ may include a plurality of unit elements, that is, memory cells, which are connected in series. For example, the memory string $MS_1$ may include memory cells $M_{11}$ through $M_{1N}$ and the memory string $MS_8$ may include memory cells $M_{81}$ through $M_{8N}$. The memory strings $MS_1$ through $MS_8$ may each have one end electrically connected to respective first selection transistors ST1_1A, ST1_2B through ST1_8A (referred to as ST1) and respective second selection transistors ST2_1B, ST2_2A through ST2_8B (referred to as ST2), respectively. In FIG. 1, characters following "_", that is, "1A" through "8B" in reference numerals of the first and second selection transistors ST1 and ST2 denote relative positions in the memory array 100 and may be omitted hereinafter if necessary.

Ones of the memory strings $MS_1$ through $MS_8$ each may have other ends electrically connected to third selection transistors $ST'_1$ through $ST'_8$, respectively. The memory strings $MS_1$ through $MS_8$ are configured such that two adjacent memory strings form one pair and are connected to one common bit line. In this regard, the memory strings $MS_1$ through $MS_8$ are connected in pairs to a plurality of common bit lines $BL_1$, $BL_2$, $BL_3$, and $BL_4$, respectively. For example, respective ends of the two adjacent memory strings $MS_1$ and $MS_2$ are commonly connected to one common bit line $BL_1$ through one common bit line contact $BC_1$. Likewise, respective ends of two other adjacent memory strings $MS_3$ and $MS_4$ are commonly connected to another common bit line $BL_2$ through another common bit line contact $BC_2$. The respective other ends of the memory strings $MS_1$ through $MS_8$ may be connected to a common source line CSL.

The first selection transistors ST1 and the second selection transistors ST2 included in one of the memory strings $MS_1$ through $MS_8$ are connected in series to each other. The second selection transistors ST2 may have a driving voltage that is lower than that of the first selection transistors ST1. In some embodiments, the second selection transistors ST2 may have the same size as that of the memory cells $M_{11}, M_{12}, \ldots, M_{8N}$, and thus may have a lower driving voltage. Some embodiments provide that the number of the second selection transistors ST2 included in one of the memory strings $MS_1$ through $MS_8$ may be two or more, and two second selection transistors may form one pair. However, the inventive concept is not limited thereto.

A respective one of the first selection transistors ST1 and the second selection transistors ST2 included in one of the memory strings $MS_1$ through $MS_8$ may be connected to and controlled by a first string selection line SSL_A and the other one of the first selection transistors ST1 and the second selection transistors ST2 may be connected to and controlled by a second string selection line SSL_B. The first and second memory strings $MS_1$ and $MS_2$ commonly connected to one common bit line $BL_1$ will now be exemplarily explained. The first selection transistor ST1_1A included in the first memory string $MS_1$ may be connected and controlled by the first string selection line SSL_A, and the second selection transistor ST2_1B may be connected to and controlled by the second string selection line SSL_B. Meanwhile, the second selection transistor ST2_2A included in the second memory string $MS_2$ may be connected to and controlled by the first string selection line SSL_A, and the first selection transistor ST1_2B may be connected to and controlled by the second string selection line SSL_B. Some embodiments provide that the first selection transistors ST1_1A and ST1_2B and the second selection transistors ST2_1B and ST2_2A included in the memory strings $MS_1$ and $MS_2$ that are connected to one common bit line $BL_1$ are alternately arranged along the first and second string selection lines SSL_A and SSL_B. Such an arrangement may be employed in the memory strings $MS_3$ through $MS_8$, which are connected to other common bit lines $BL_2$, $BL_3$, and $BL_4$, respectively. Further, as shown in FIG. 1, the first and second selection transistors ST1_1A and ST2_1B, and ST1_2B and ST2_2A respectively included in the memory strings $MS_1$ and $MS_2$, which form one pair and may be connected to the one common bit line $BL_1$, may be arranged to be symmetric with respect to first and second selection transistors ST2_3A and ST1_3B, and ST1_4A and ST2_4B, respectively included in the memory strings $MS_3$ and $MS_4$, which are connected to another adjacent common bit line $BL_2$. Some embodiments provide that such an arrangement may be entirely or partially employed in the memory strings $MS_1$ through $MS_8$ that are connected to the one common bit lines $BL_1$, $BL_2$, $BL_3$, and $BL_4$, respectively.

In some embodiments, the first and second string selection lines SSL_A and SSL_B may cross the memory strings $MS_1$ through $MS_8$. Some embodiments provide that the first and second string selection lines SSL_A and SSL_B may be arranged in different rows. In some embodiments, the third selection transistors $ST'_1$ through $ST'_8$ may be controlled by a ground select line GSL.

A plurality of memory cells $M_1$ through $M_8$ may be controlled by word lines $WL_1$ through $WL_N$. The illustrated configurations of the first selection transistors ST1 and the second selection transistors ST2, the string selection lines SSL_A and SSL_B, and the common source line CSL that provide a semiconductor memory device in which the common bit lines $BL_1$, $BL_2$, $BL_3$, and $BL_4$ are shared by the memory strings $MS_1$ through $MS_8$ are provided herein as non-limiting examples.

Since two adjacent memory strings share one common bit line through one common bit line contact, the number of bit lines can be reduced and a pitch between bit line contacts can be increased. The number of bit lines used in the nonvolatile memory array 100 of FIG. 1 is 4, which may be reduced compared with the number of bit lines (8) used in a conventional NAND-type nonvolatile memory array in which one bit line is assigned to one memory string. Accordingly, design rules associated with how a bit line and a bit line contact are formed may be relaxed. In this regard, since a distance between bit lines may be increased, a parasitic capacitance between the bit lines may be reduced, which may result in higher operating speeds. Common bit line contacts $BC_1$, $BC_2$, $BC_3$, and $BC_4$ through which the common bit lines $BL_1$, $BL_2$, $BL_3$, and $BL_4$ are shared may be arranged in parallel. However, the inventive concept is not limited thereto. For example, some embodiments provide that the common bit line contacts $BC_1$, $BC_2$, $BC_3$, and $BC_4$ may be arranged in a zigzag fashion that is not parallel to one another.

Although two adjacent memory strings share one bit line as illustrated in FIG. 1, some embodiments may provide that three or more adjacent memory strings may share one common bit line through one common bit line contact. In some embodiments, a common bit line structure as illustrated in FIG. 1 may be employed in an AND and/or NOR-type nonvolatile memory architecture.

Methods of driving the first selection transistors ST1 and the second selection transistors ST2 included in the memory strings $MS_1$ through $MS_8$ will now be explained in detail. Although the memory strings $MS_1$ and $MS_2$, which form one pair and are connected to one common bit line $BL_1$, will be exemplarily explained, such methods may also be used to drive the first and second selection transistors ST1 and ST2 of the other memory strings $MS_3$ through $MS_8$, which are connected to the other common bit lines $BL_2$ through $BL_4$. By way of example, a voltage applied to drive the first selection transistors ST1 is referred to as $V_{t1}$ and a voltage applied to drive the second selection transistors ST2 is referred to as $V_{t2}$. The voltage $V_{t1}$ is greater than the voltage $V_{t2}$ as described above.

A voltage $V_{t1}$ is applied to the first string selection line SSL_A, and a voltage $V_{t2}$ is applied to the second string selection line SSL_B. Due to the applied voltages $V_{t1}$ and $V_{t2}$, the first selection transistor ST1_1A of the first memory string $MS_1$ is driven and the second selection transistors ST2_1B are also driven. Meanwhile, the second selection transistors ST2_2A of the second memory string $MS_2$ are driven, but the first selection transistor ST1_2B is not driven because the voltage $V_{t2}$ is lower than a driving voltage of the first selection transistor ST1_2B. Accordingly, the first memory string $MS_1$ is selected and connected to the bit line $BL_1$.

Next, a voltage $V_{t2}$ is applied to the first string selection line SSL_A and a voltage $V_{t1}$ is applied to the second string selection line SSL_B. Due to the applied voltages $V_{t2}$ and $V_{t1}$, the first selection transistor ST1_1A of the first memory string $MS_1$ is not driven because the voltage $V_{t2}$ is lower than a driving voltage of the first selection transistor ST1_1A, but the second selection transistors ST2_1B are driven. Meanwhile, both the second selection transistors ST2_2A and the first selection transistor ST1_2B of the second memory string $MS_2$ are driven. Accordingly, the second memory string $MS_2$ is selected and connected to the bit line $BL_1$.

In this regard, such driving methods may be applied to the nonvolatile memory array 100. If a voltage $V_{t1}$ is applied to the first string selection line SSL_A and a voltage $V_{t2}$ is applied to the second string selection line SSL_B, the first, fourth, fifth, and eighth memory strings $MS_1$, $MS_4$, $MS_5$ and $MS_8$ are selected and connected to the bit lines $BL_1$, $BL_2$, $BL_3$, and $BL_4$, respectively. Meanwhile, if a voltage $V_{t2}$ is applied to the first string select line SSL_A and a voltage $V_{t1}$ is applied to the second string selection line SSL_B, the second, third, sixth, and seventh memory strings $MS_2$, $MS_3$, $MS_6$ and $MS_7$ are selected and connected to the bit lines $BL_1$, $BL_2$, $BL_3$, and $BL_4$, respectively. Accordingly, a desired memory string can be selected and connected to a bit line by varying voltages applied to the first and second string selection lines SSL_A and SSL_B according to driving voltages of the first and second selection transistors ST1 and ST2.

Semiconductor memory devices for realizing the nonvolatile memory array 100 of FIG. 1, according to various embodiments will now be explained in detail.

Figure 2:
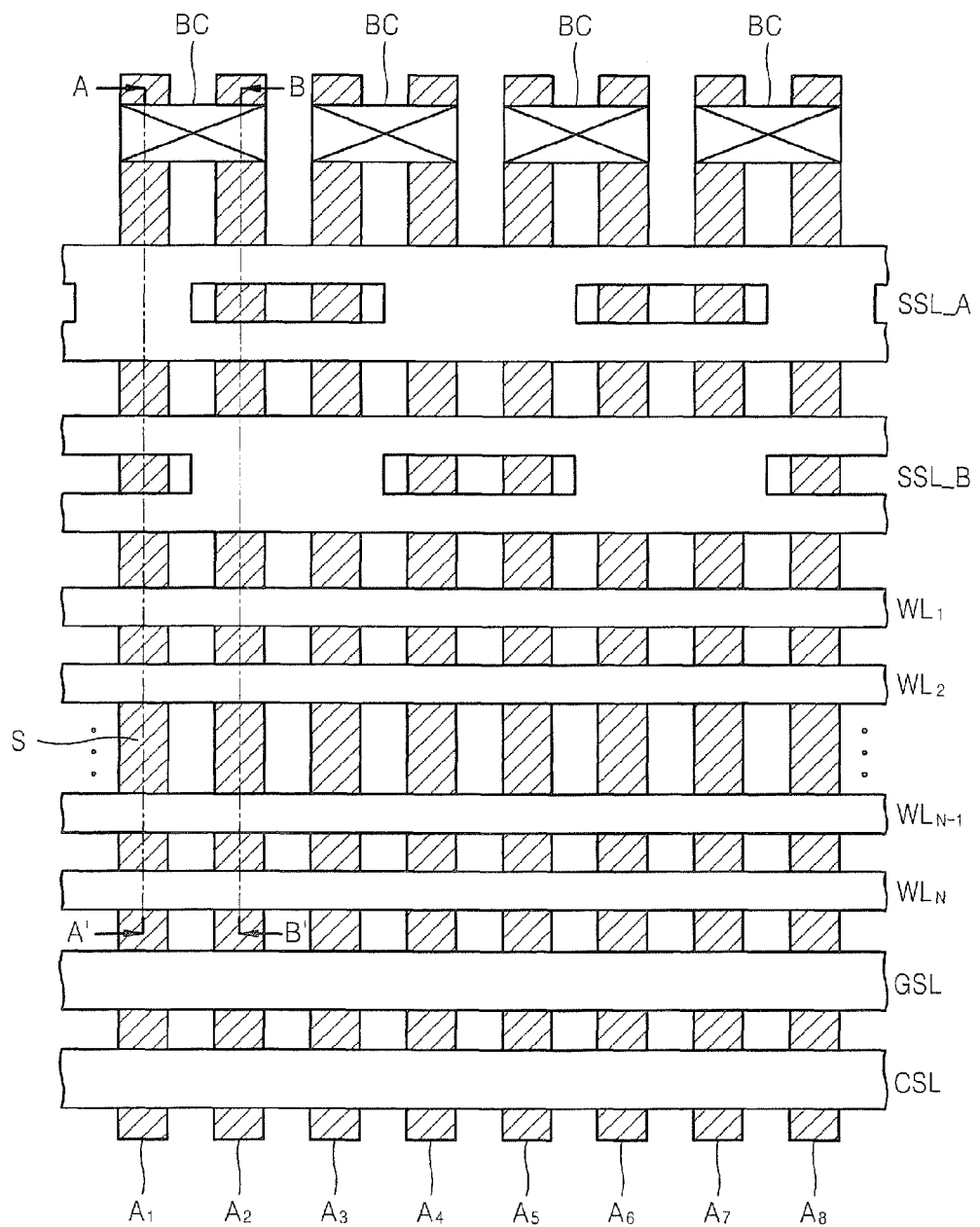
FIG. 2 is a plan view of a nonvolatile memory device according to some embodiments of the present invention.

FIG. 2 is a plan view of a nonvolatile memory device according to some embodiments of the present invention.

Figure 3A:
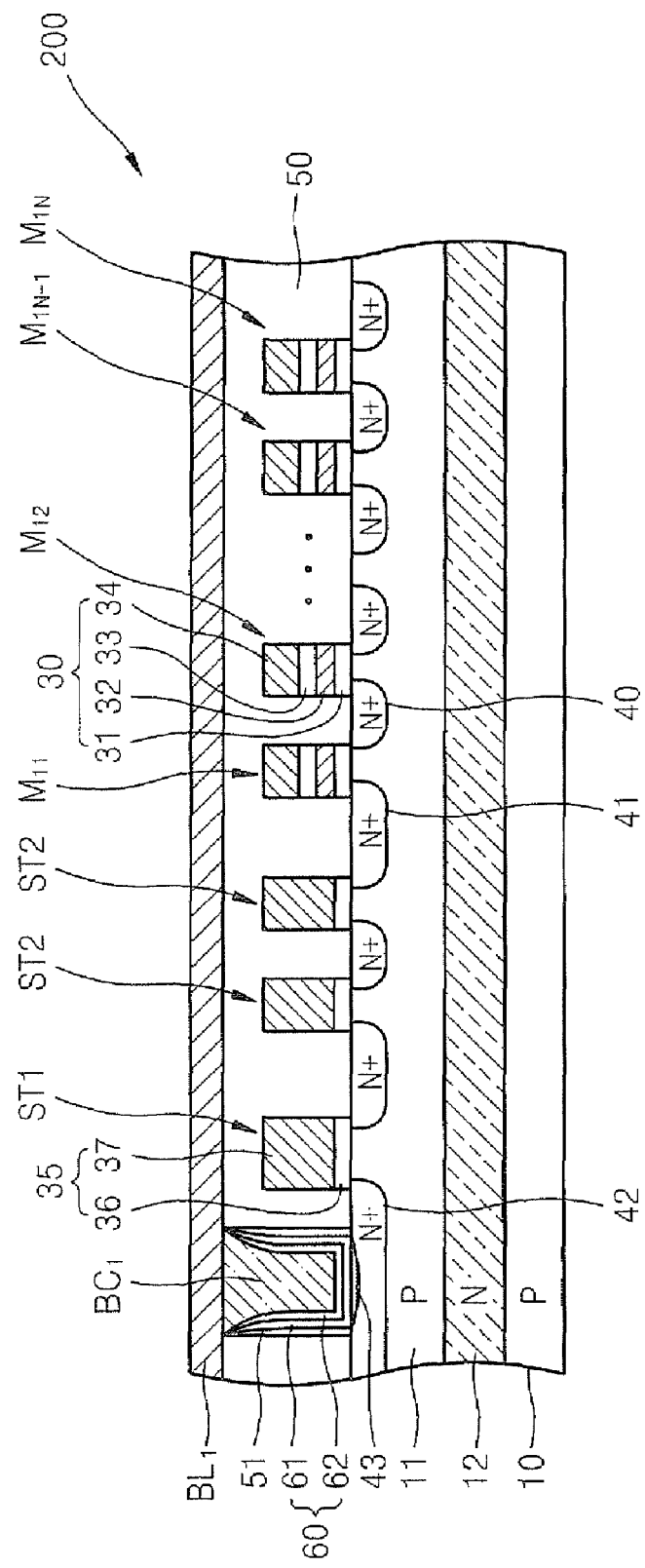
FIGS. 3A and 3B are cross-sectional views respectively taken along lines A-A" and B-B' of FIG. 2.
Figure 3B:
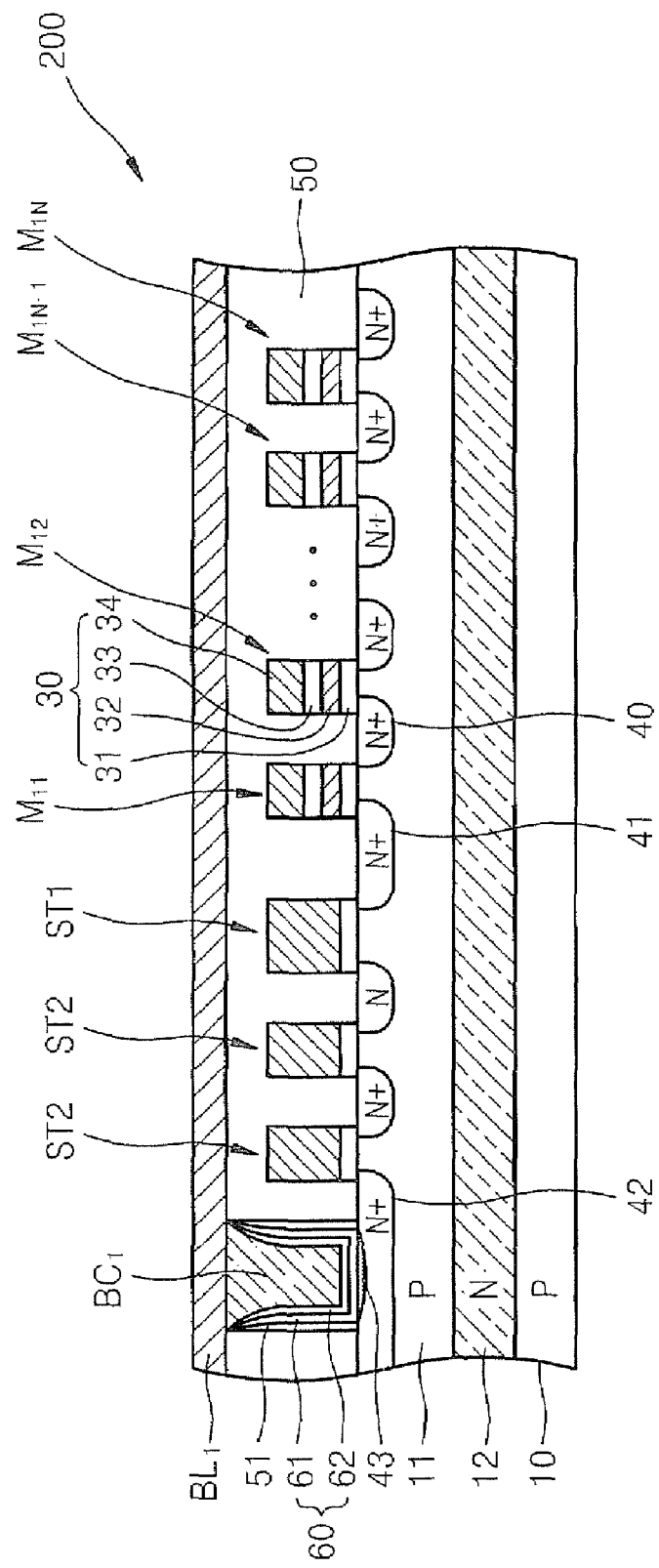

FIGS. 3A and 3B are cross-sectional views respectively taken along lines A-A' and B-B' of FIG. 2. Although some elements are omitted in FIG. 2 for convenience of explanation, the omitted elements are illustrated in FIGS. 3A and 3B.

Referring to FIGS. 2, 3A and 3B, the nonvolatile memory device includes a plurality of memory cell columns $A_1$ through $A_8$, which may be formed on a substrate 10 and extend in a first direction. The substrate 10 may include any of silicon-on-insulator, silicon-on-sapphire, germanium, silicon-germanium, and/or gallium-arsenide, among others. Active regions S constituting the memory cell columns $A_1$ through $A_8$ may be defined by forming an element isolation layer (not shown), such as, for example, a shallow trench isolation (STI) layer, in the substrate 10.

In some embodiments, the substrate 10 may include a P-type well region 11. Some embodiments provide that the P-type well region 11 may be surrounded by an N-type well region 12. A plurality of unit elements, e.g., the memory cell transistors $M_{11}$, $M_{12}$ through $M_{1N-1}$, $M_{1N}$, may be formed on the active regions S, respectively. Each of the memory cell transistors $M_{11}$, $M_{12}$ through $M_{1N-1}$, $M_{1N}$ may include a gate stack 30 including a lower insulating layer 31, a charge storage layer 32, an upper insulating layer 33, and/or a control gate 34, which may be sequentially stacked on each of the active regions S. The gate stack 30 may be formed by sequentially stacking the lower insulating layer 31, the charge storage layer 32, the upper insulating layer 33, and/or the control gate 34, among others, on the substrate 10 and patterning the sequentially stacked layers 31 through 34. Next, spacers (not shown) may be further formed on sidewalls of the gate stack 30. Source/drain regions 40, which are N+ source/drain regions, may be formed by using the gate stack 30 and/or the spacers as ion injection masks. Some embodiments provide that the memory cell transistors $M_{11}$, $M_{12}$ through $M_{1N-1}$, $M_{1N}$ define the memory cell column $A_1$ through $A_8$ by sharing the source/drain regions 40 spaced apart by the gate stack 30 and by being connected in series. The control gates 34 of the memory cell transistors $M_{11}$, $M_{12}$ through $M_{1N-1}$, $M_{1N}$ may be formed as word lines $WL_1$, $WL_2$ through $WL_{N-1}$, $WL_N$, respectively. In some embodiments, the word lines $WL_1$, $WL_2$ through $WL_{N-1}$, $W_N$ may extend in a second direction that is perpendicular to the first direction so as to intersect the plurality of memory cell columns $A_1$ through $A_8$. Accordingly, some embodiments provide that the plurality of unit elements may be arranged in a NAND configuration.

In order to realize the nonvolatile memory device, the charge storage layer 32 may include a floated conductive layer and/or a charge trap layer providing trapping centers of electrons and/or holes. The lower insulating layer 31 and the upper insulating layer 32 may function as tunneling insulating layers and/or blocking insulating layers according to a program/erase modes of the semiconductor memory device. For example, the charge trap layer may be a silicon nitride layer, a metal nitride layer, and/or a metal oxide layer, among others. In some embodiments, the floated conductive layer may be a doped polysilicon layer, a metal layer, a conductive metal nitride layer, and/or a conductive metal oxide layer, among others. Some embodiments provide that each of the tunneling insulating layer and the blocking insulating layer may be a silicon oxide layer, and/or a high-k layer having a dielectric constant that is higher than that of the silicon oxide layer, such as a silicon oxynitride layer, a silicon nitride layer, an aluminum oxide layer, a lanthanum oxide layer, a lanthanum aluminum oxide layer, a hafnium oxide layer, a hafnium aluminum oxide layer, a lanthanum hafnium oxide layer, a zirconium oxide layer, and/or a tantalum oxide layer, among others. The structure of the gate stack 30, and the function, order, and materials of the lower insulating layer 31, the charge storage layer 32, the upper insulating layer 33, and the control gate 34 are explained by way of non-limiting example. Some embodiments provide that each of the lower insulating layer 31, the charge storage layer 32, the upper insulating layer 33, and the control gate 34 constituting the gate stack 30 may be formed by stacking two or more layers in order to improve its function, and/or a new layer, such as a nano crystal layer, may be interposed between the lower insulating layer 31, the charge storage layer 32, the upper insulating layer 33, and/or the control gate 34. In some embodiments, surfaces of the lower insulating layer 31, the charge storage layer 32, the upper insulating layer 33, and/or the control gate 34 may be processed. Some embodiments provide that the gate stack 30 may have a split gate-type structure for a multi bit operation, and/or a three dimensional (3D) fin-type structure.

In some embodiments, source/drain regions 40 of the memory cell transistors $M_{11}$, $M_{21}$, through $M_{81}$, which are connected to one respective end of each of the memory cell columns $A_1$ through $A_8$, may be connected to bit lines $BL_1$ through $BL_4$ through the first selection transistors ST1 and the second selection transistors ST2. Although not shown, as described above with reference to FIG. 1, source/drain regions of the memory cell transistors $M_{1N}$, $M_{2N}$ through $M_{8N}$, which are connected to the other ends of the memory cell columns $A_1$ through $A_8$, may be connected to the common source line CSL through the third selection transistors $ST'_1$ through $ST'_8$ (see FIG. 1).

Some embodiments provide that the first selection transistors ST1 and the second selection transistors ST2 may be fabricated by sequentially stacking a gate insulating layer 36 and a control gate 37 and patterning the stacked gate insulating layer 36 and control gate 37. In some embodiments, source/drain regions 40, 41, and 42 may be formed by using the gate stack 35 as an ion injection mask. Methods of fabricating the memory cell transistors $M_{1N}$, $M_{2N}$ through $M_{8N}$ and the first and second selection transistors ST1 and ST2 is explained by way of non-limiting example. In some embodiments, the memory cell transistors $M_{1N}$, $M_{2N}$ through $M_{8N}$ and the first and second selection transistors ST1 and ST2 may be independently formed. Some embodiments provide that a common process, for example, an ion injection process for forming the source/drain regions 40, 41, and 42, may be performed simultaneously on the memory cell transistors $M_{1N}$, $M_{2N}$ through $M_{8N}$ and the first and second selection transistors ST1 and ST2.

After the memory cell transistors $M_{1N}$, $M_{2N}$ through $M_{8N}$ and the first and second selection transistors ST1 and ST2 are formed, an interlayer insulating layer 50 may be formed on the substrate 10. Some embodiments provide that the interlayer insulating layer 50 may be a silicon oxide layer formed by plasma enhanced chemical vapor deposition (PECVD).

The common bit line contacts $BC_1$, $BC_2$, $BC_3$, and $BC_4$ for electrically connecting the common bit lines $BL_1$, $BL_2$, $BL_3$, and $BL_4$ and the first selection transistors ST1 or the second selection transistors ST2 may be commonly connected to the source/drain regions 42 of adjacent first selection transistors ST1 or second selection transistors ST2. Accordingly, two adjacent memory cell columns may be commonly connected to one common bit line.

In the semiconductor memory device of FIG. 2, as described above, since two adjacent memory strings may share one common bit line, a pitch between bit line contacts can be increased. In some embodiments, each of the common bit line contacts $BC_1$, $BC_2$, $BC_3$, and $BC_4$ may be formed over adjacent active regions S and an element isolation layer (not shown) between the active regions S as shown in FIG. 2 in order to be commonly connected to the source/drain regions 42 of two adjacent selection transistors. That is, each of the common bit line contacts $BC_1$, $BC_2$, $BC_3$, and $BC_4$ may have a borderless contact structure that is formed over the active regions S and/or a non-active region. Some embodiments provide that the common bit line contacts $BC_1$, $BC_2$, $BC_3$, and $BC_4$ each having such a borderless contact structure may be formed by forming a contact hole through which surfaces of source/drain regions 42 of two adjacent selection transistors and an element isolation layer (not shown) between the source/drain regions 42 are exposed in the interlayer insulating layer 50 and filling the contact hole with a conductive material, such as copper (Cu), tungsten (W), and/or doped polysilicon (poly-Si).

After the common bit line contacts $BC_1$, $BC_2$, $BC_3$, and $BC_4$ are formed, the common bit lines $BL_1$, $BL_2$, $BL_3$, and $BL_4$ connected to the common bit line contacts $BC_1$, $BC_2$, $BC_3$, and $BC_4$ may be formed. Some embodiments provide that each of the common bit lines $BL_1$, $BL_2$, $BL_3$, and $BL_4$ may be formed by forming a conductive layer made of aluminum and/or copper on the interlayer insulating layer 50 and patterning the conductive layer in the form of a line.

Reference is now made to FIGS. 4A through 4I, which are cross-sectional views illustrating methods of fabricating the nonvolatile memory device of FIG. 2, according to some embodiments of the present invention. In FIGS. 4A through 4I, a region A-A' corresponds to a cross-section taken along line A-A' of FIG. 2, and a region B-B' corresponds to a cross-section taken along line B-B' of FIG. 2.

Figure 4A:
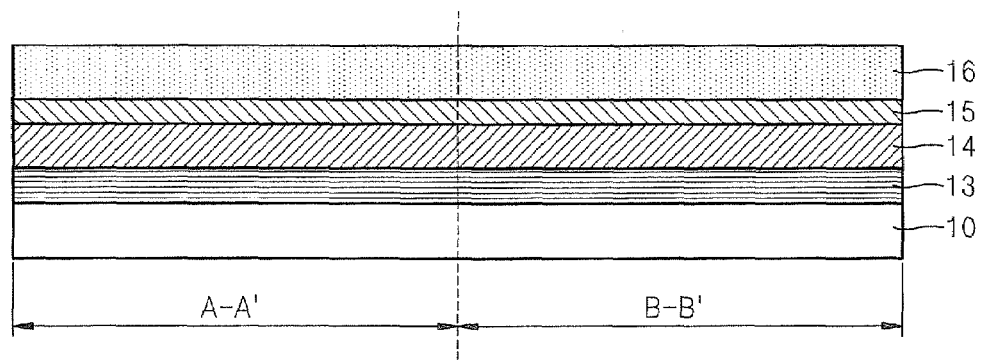

Referring to FIG. 4A, a first mask layer 16 and a second mask layer 15 may be formed over the substrate 10 on which a gate stack layer 13 is formed. The first mask layer 16 and the second mask layer 15 may have different etch selectivities. Some embodiments provide that the first mask layer 16 may be a photoresist layer, or a hard mask layer including a silicon oxide, a silicon nitride, and/or a silicon oxynitride, among others. For example, in some embodiments, the first mask layer 16 may be a spin-on-hardmask (SOH) layer. In some embodiments, the second mask layer 15 may be a polysilicon layer. Some embodiments provide that the materials of the first mask layer 16 and the second mask layer 15 may be exchanged. In some embodiments, a protective layer 14 for protecting the gate stack layer 13 may be formed between the substrate 10 and the second mask layer 15. Some embodiments provide that the protective layer 14 may be a hard mask layer including a silicon oxide, a silicon nitride, and/or a silicon oxynitride, among others. The gate stack layer 13 may include a silicon oxide layer, a silicon nitride layer, a metal layer, or a combination thereof. Some embodiments provide that the gate stack layer 13 may include at least one of a tunneling insulating layer, a charge storage layer, a blocking insulating layer, and/or a control gate layer, among others.

Figure 4B:
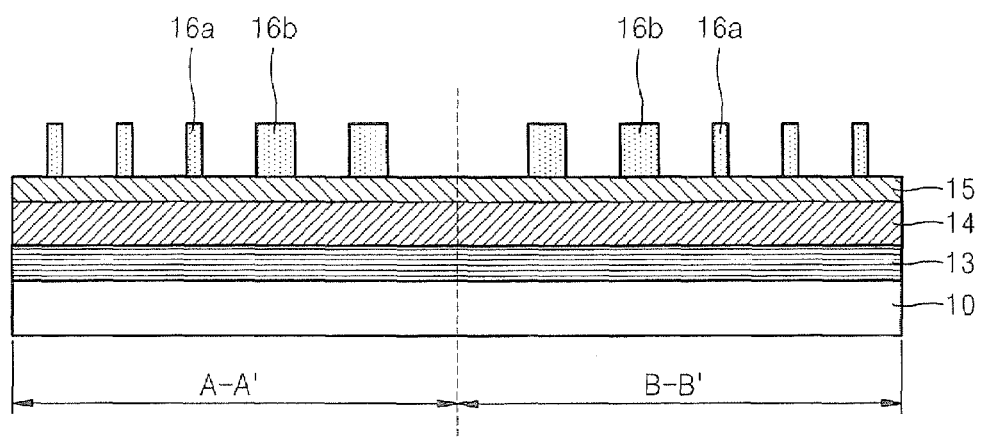

Referring to FIG. 4B, the first mask layer 16 may be patterned to form first mask patterns 16a and 16b. The first mask patterns 16a and 16b may have the same width or different widths from one another. In some embodiments, the width of the first mask patterns 16a corresponding to regions on which memory cell transistors M (see FIG. 4H) may be formed to be narrower than the width of the first mask patterns 16b corresponding to regions on which selection transistors ST1 and ST2 (see FIG. 4H) are to be formed.

Figure 4C:
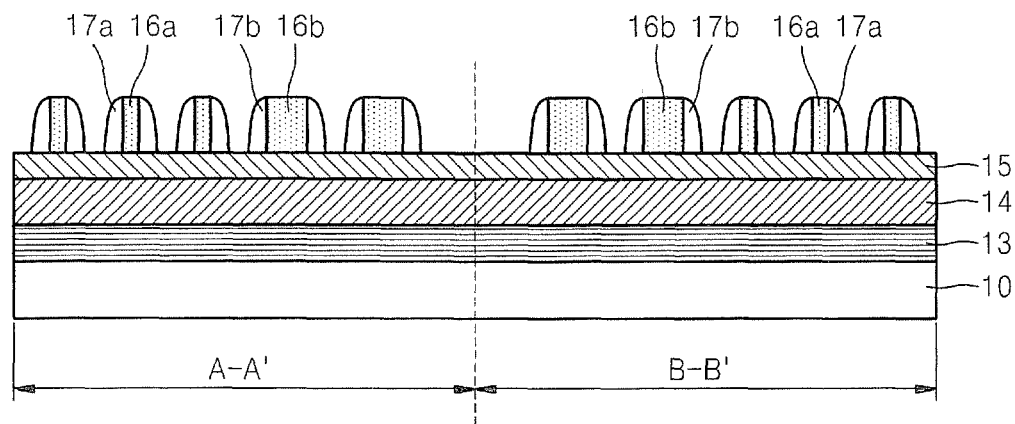

Referring to FIG. 4C, spacers 17a and 17b may be formed on sidewalls of the first mask patterns 16a and 16b. Some embodiments provide that the spacers 17a and 17b have etch resistances that are higher than those of the first mask patterns 16a and 16b. For example, in some embodiments, the spacers 17a and 17b may be formed by atomic layer deposition (ALD). Some embodiments provide that the spacers 17a and 17b may have the same width or different widths from one another.

Figure 4D:
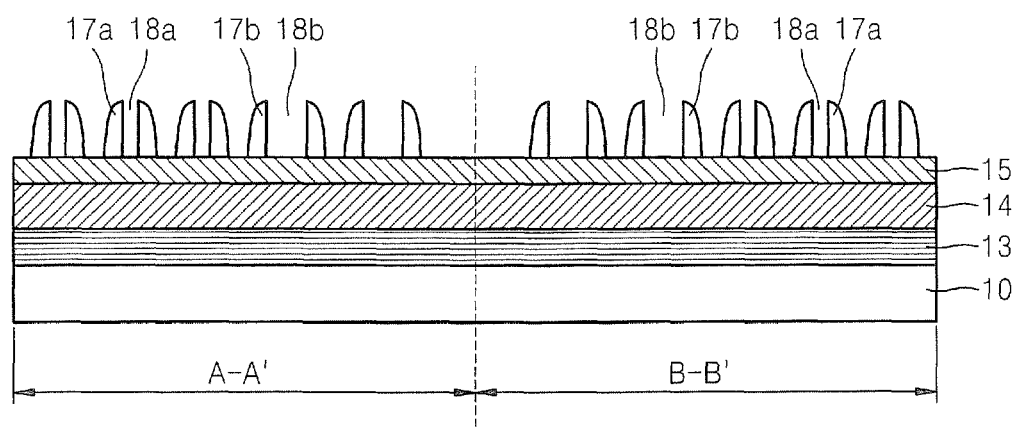

Referring to FIG. 4D, the first mask patterns 16a and 16b may be removed. As described above, since the spacers 17a and 17b may have etch resistances that are higher than those of the first mask patterns 16a and 16b, openings 18a and 18b may be formed between the spacers 17a and 17b.

Figure 4E:
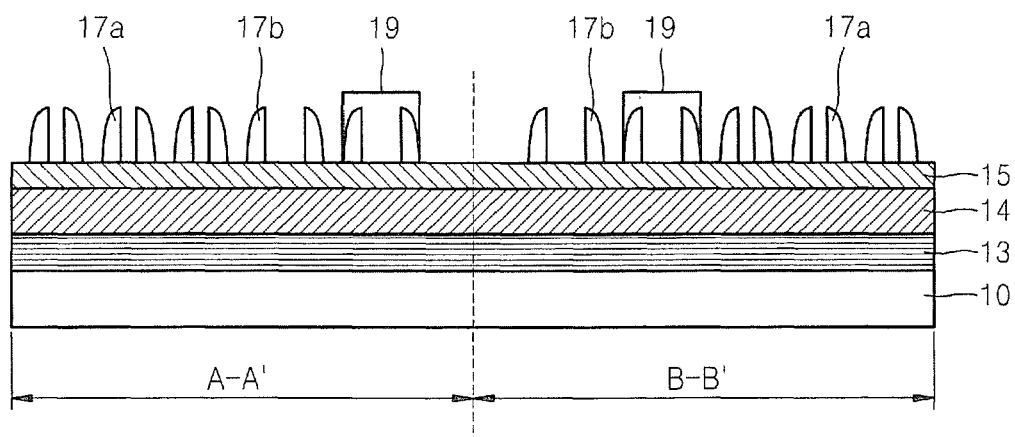

Referring to FIG. 4E, a spacer protective pattern 19 covering some of the spacers 17b may be formed. Some embodiments provide that the spacer protective pattern 19 has an etch selectivity that is different from that of the second mask layer 15. The spacer protective pattern 19 may be a hard mask layer including a silicon oxide, a silicon nitride, and/or a silicon oxynitride, among others. In some embodiments, a region covered by the spacer protective pattern 19 corresponds to a region on which the first selection transistor ST1 is to be formed in a subsequent process. Some embodiments provide that the position of the spacer protective pattern 19 may vary depending on the position of the first selection transistor ST1 relative to the second selection transistors ST2. For example, in some embodiments, in the region A-A', the spacer protective pattern 19 covers an outermost spacer 17b, and in the region B-B', the spacer protective pattern 19 covers a spacer 17a located between the spacers 17a and 17b.

Figure 4F:
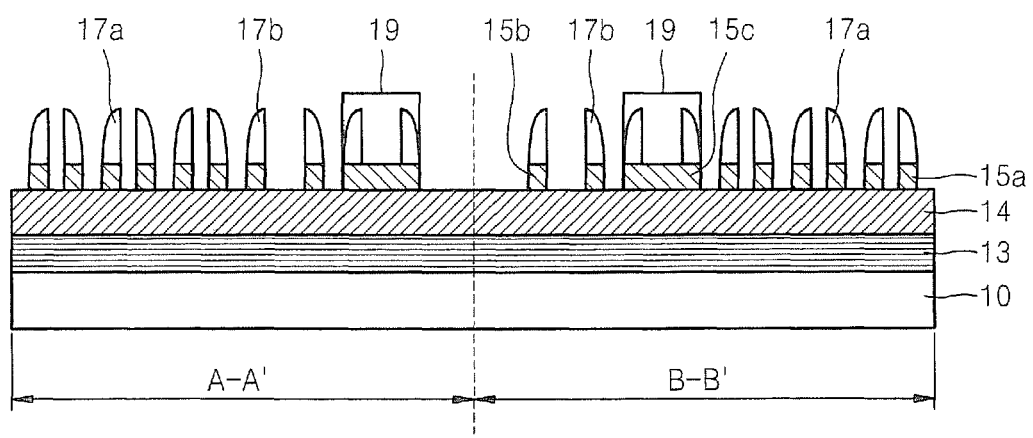

Referring to FIG. 4F, the second mask layer 15 may be patterned by using the spacers 17a and 17b and the spacer protective pattern 19 as etch masks to form second mask patterns 15a, 15b, and 15c. If the second mask layer 15 is formed of polysilicon as described above, the second mask layer 15 may have an etch selectivity that is different from those of the spacer protective pattern 19 and the spacers 17a and 17b, which are formed of an oxide, a nitride, and/or an oxynitride, among others. The width of the second mask pattern 15a corresponding to regions on which the memory cell transistors M are to be formed may be relatively small, and, in some embodiments, may be the same as the width of the second mask pattern 15b corresponding to regions on which the second selection transistors ST2 are to be formed. Meanwhile, the width of the second mask pattern 15c corresponding to the region on which the first selection transistor ST1 is to be formed may be greater than the width of each of the second mask patterns 15a and 15b.

Figure 4G:
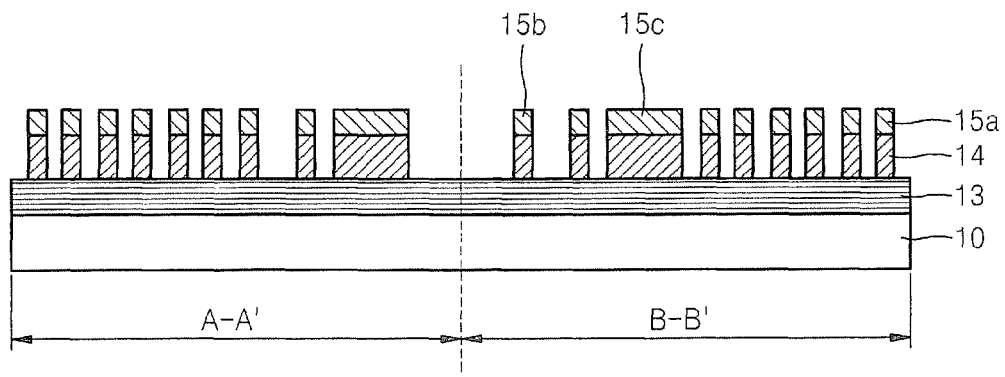
Figure 4H:
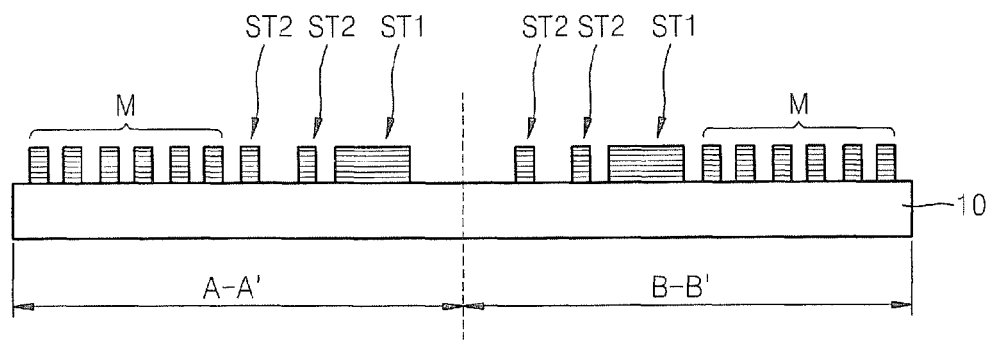

Referring to FIGS. 4G and 4H, a portion of the substrate 10, that is, a portion of the gate stack layer 13, may be removed by using the second mask patterns 15a, 15b, and 15c, to form the plurality of unit elements M and the first and second selection transistors ST1 and ST2. A protective layer 14 may protect the portion of the gate stack layer 13 under the protective layer 14 from being etched while the portion of the gate stack layer 13 is removed.

Referring to FIG. 4I, an interlayer insulating layer 50 covering the plurality of unit elements M and the first and second selection transistors ST1 and ST2 may be formed on the substrate 10. Some embodiments provide that the interlayer insulating layer 50 is etched and a conductive material is filled to form a common bit line contact BC. In some embodiments, a common bit line BL electrically connected to the common bit line contact BC is formed on the interlayer insulating layer 50.

Figure 6:
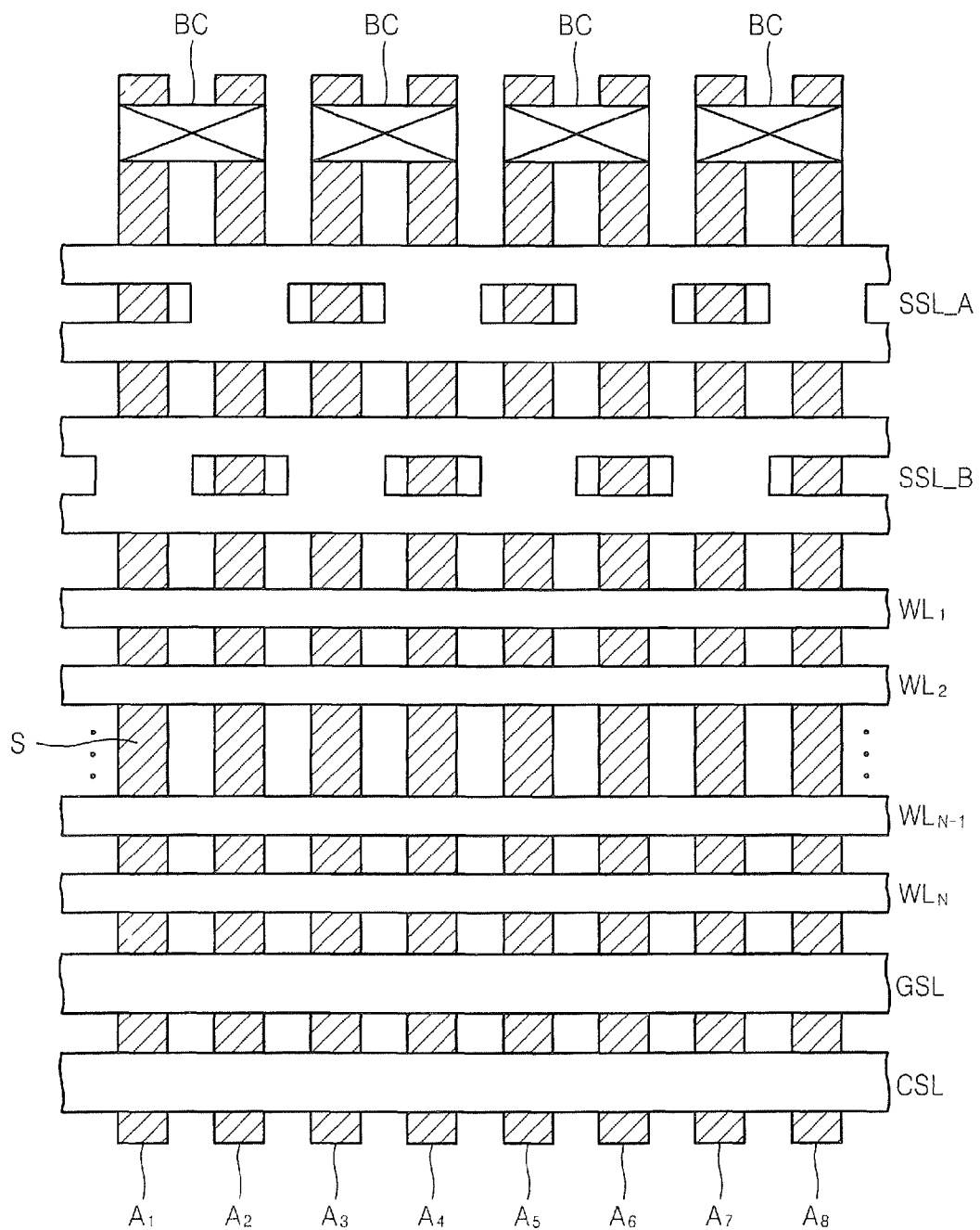
FIG. 6 is a plan view of a nonvolatile memory device according to some embodiments of the present invention.

FIG. 5 is a circuit diagram of a nonvolatile memory array 200 according to some embodiments of the present invention. FIG. 6 is a plan view of a nonvolatile memory device according to some embodiments of the present invention. Repeated explanation for the same elements described above will not be given for convenience of explanation.

Referring to FIGS. 5 and 6, the nonvolatile memory array 200 is configured such that two adjacent memory strings form one pair and are connected to one common bit line, and thus memory strings $MS_1$ through $MS_8$ are connected in pairs to a plurality of common bit lines $BL_1$, $BL_2$, $BL_3$, and $BL_4$, respectively. First and second selection transistors ST1 and ST2 included in each of the memory strings $MS_1$ through $MS_8$ are alternately arranged along first and second string selection lines SSL_A and SSL_B. In contrast with the nonvolatile memory array 100 of FIG. 1, first and second selection transistors ST2_1A and ST1_1B, and ST1_2A and ST2_2B included in the memory strings $MS_1$ and $MS_2$ which form one pair and are connected to the one common bit line $BL_1$ may be arranged in the same order as that of first and second selection transistors ST2_3A and ST1_3B, and ST1_4A and ST2_4B included in the memory strings $MS_3$ and $MS_4$ connected to another adjacent common bit line $BL_2$. Such an arrangement may be entirely or partially employed in the memory strings $MS_1$ through $MS_8$, which are connected to the one common bit lines $BL_1$, $BL_2$, $BL_3$, and $BL_4$, respectively.

Figure 7:
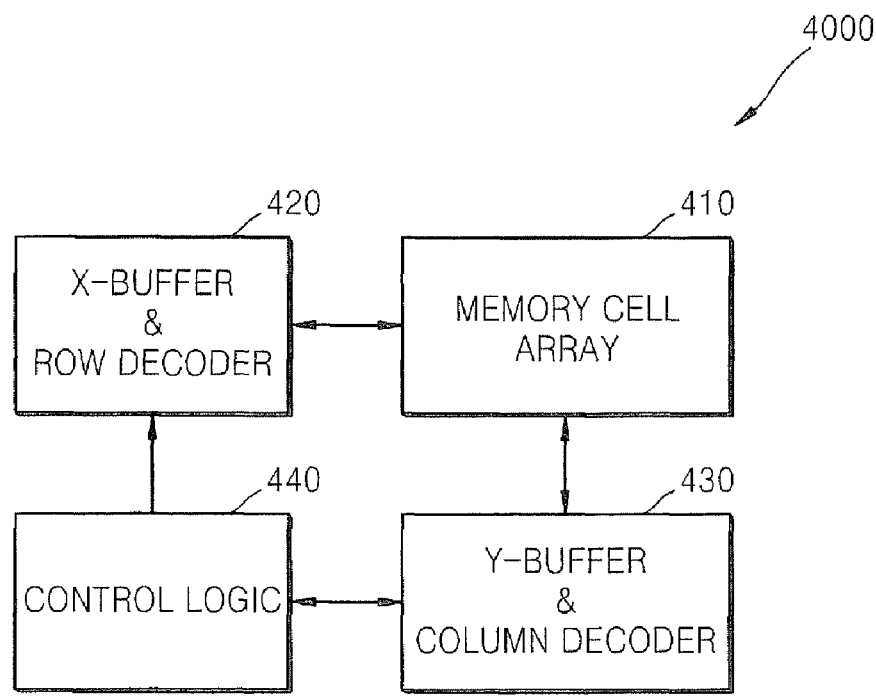
FIG. 7 is a block diagram of a memory chip according to some embodiments of the present invention.

Reference is now made to FIG. 7, which is a block diagram of a memory chip 4000 according to some embodiments of the present invention. In some embodiments, a memory cell array 410 may include any one structure of the nonvolatile memory devices of FIGS. 2 and 6. The memory cell array 410 may be coupled to an X-buffer & row decoder 420 and a Y-buffer & column decoder 430 to receive and transmit data. For example, word lines of the memory cell array 410 may be connected to the X-buffer & row decoder 420. Some embodiments provide that bit lines of the memory cell array 410 may be connected to the Y-buffer & column decoder 430. A control logic 440 may be coupled to the X-buffer & row decoder 420 and the Y-buffer & column decoder 430 to control the X-buffer & row decoder 420 and the Y-buffer & column decoder 430.

Figure 8:
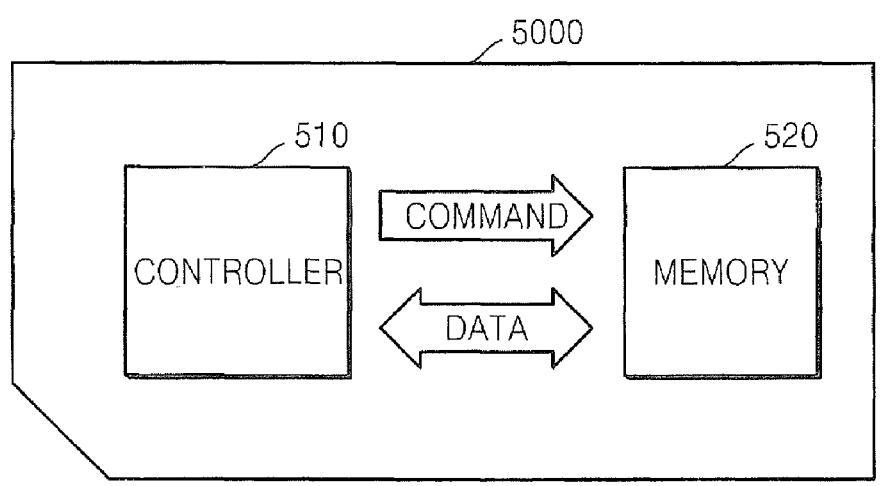
FIG. 8 is a block diagram of a memory card according to some embodiments of the present invention.

Reference is now made to FIG. 8, which is a block diagram of a memory card 5000 according to some embodiments of the present invention. Some embodiments provide that a controller 510 and a memory 520 may be disposed to exchange an electrical signal with each other. For example, if the controller 510 gives a command to the memory 520, the memory 520 may transmit data. The memory 520 may include any of the nonvolatile memory devices of FIGS. 1 through 6. Some embodiments provide that the nonvolatile memory devices of FIGS. 1 through 6 may be employed in NAND or NOR-type memory arrays (not shown) according to a desired logic gate design. In some embodiments, the memory arrays disposed in a plurality of rows and columns may have one or more memory array banks (not shown). Some embodiments provide that the memory 520 may include such a memory array (not shown) or a memory array bank (not shown). In some embodiments, the memory card 5000 may further include a row decoder (not shown), a column decoder (not shown), input/output (I/O) buffers (not shown), and/or a control register (not shown), among others, in order to drive the memory array bank. The memory card 5000 may be used as a memory device such as a memory stick card, a secure media (SM) card, a secure digital (SD) card, a mini SD card, and/or a multimedia card (MMC), among others.

Figure 9:
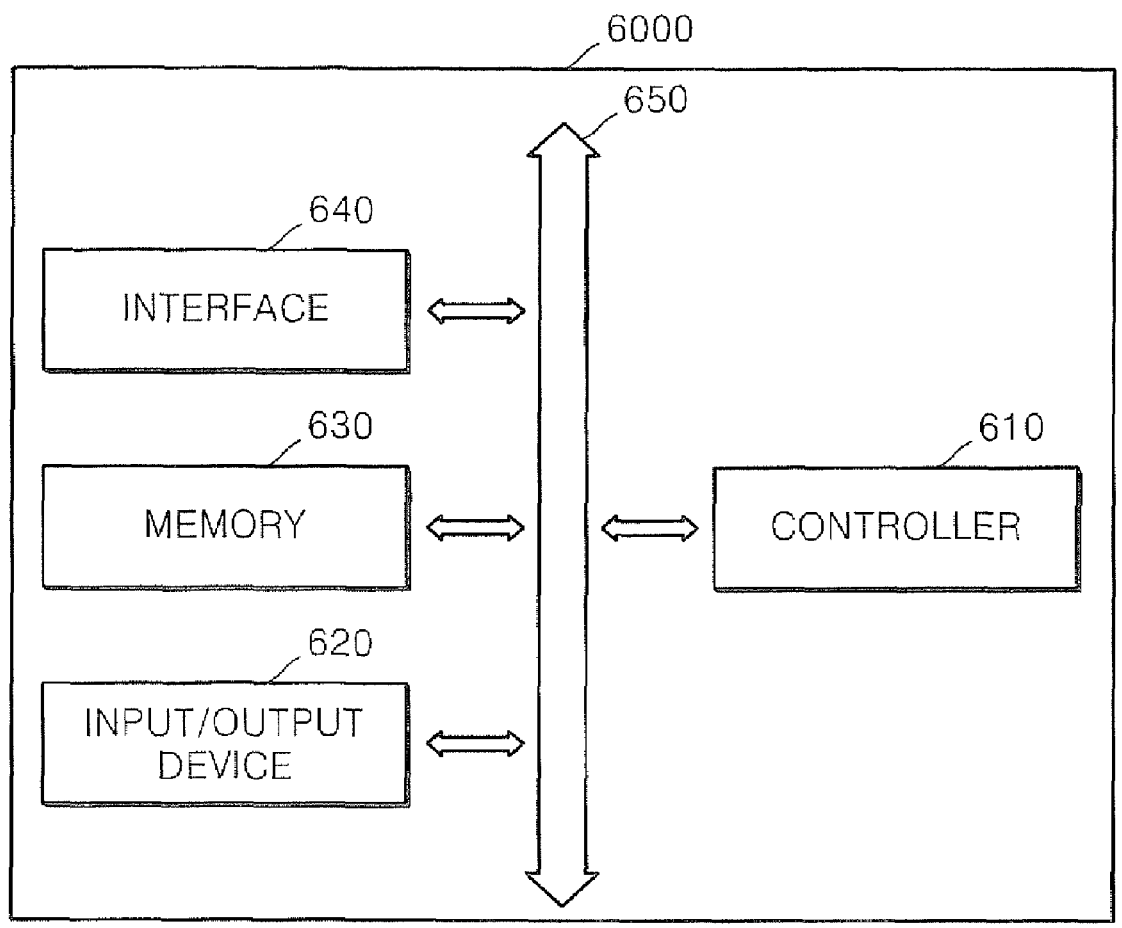
FIG. 9 is a block diagram of a system according to some embodiments of the present invention.

Reference is now made to FIG. 9, which is a block diagram of a system 6000 according to some embodiments of the present invention. In some embodiments, the system 600 may include a controller 610, an input/output device 620, a memory 630, and/or an interface 640, among others. Some embodiments provide that the system 6000 may be a mobile system and/or a system that transmits or receives data. In some embodiments, the mobile system may be a personal digital assistant (PDA), a portable computer, a web tablet, a wireless phone, a mobile phone, a digital music player, and/or a memory card, among others. Some embodiments provide that the controller 610 may execute a software program and control the system 6000. For example, the controller 610 may be a microprocessor, a digital signal processor, a microcontroller, and/or the like. Some embodiments provide that the input/output device 620 may be used to input or output data to or from the system 6000. In some embodiments, the system 6000 may be connected to an external device, for example, a personal computer (PC) or a network, by using the input/output device 630 to exchange data with the external device. Some embodiments provide that the input/output device 620 may be a keypad, a keyboard, and/or a display device, among others. In some embodiments, the memory 630 may store codes and/or data for operating the controller 610, and/or may store data processed by the controller 610. The memory 630 may include any of the nonvolatile memory devices of FIGS. 2 and 6. Some embodiments provide that the interface 640 may be a data transmission path between the system 6000 and an external device. The controller 610, the input/output device 620, the memory 630, and/or the interface 640 may communicate with one another via a bus 650. For example, the system 6000 may be applied to a mobile phone, an MP3 player, a navigation system, a portable multimedia player (PMP), a solid state disk (SSD), and/or a household appliance, among others.

The foregoing is illustrative of the present invention and is not to be construed as limiting thereof. Although a few embodiments of the present invention have been described, those skilled in the art will readily appreciate that many modifications are possible in the embodiments without materially departing from the novel teachings and advantages of the present invention. Accordingly, all such modifications are intended to be included within the scope of the present invention as defined in the claims. Therefore, it is to be understood that the foregoing is illustrative of the present invention and is not to be construed as limited to the embodiments disclosed herein, and that modifications to the disclosed embodiments, as well as other embodiments, are intended to be included within the scope of the appended claims. The present invention is defined by the following claims.

What is claimed is:

1. A nonvolatile memory device having a common bit line structure, the nonvolatile memory device comprising:
    a plurality of first selection transistors having a first driving voltage;
    a plurality of second selection transistors, at least two of which are connected in series with the first selection transistor, and ones of the plurality of second selection transistors having a second driving voltage that is lower than the first driving voltage;
    a first memory string comprising a first one of the plurality of first selection transistors and a first at least two of the plurality of second selection transistors;
    a second memory string comprising a second one of the plurality of the first selection transistors and a second at least two of the plurality of second selection transistors;
    a first string selection line connected to the first one of the plurality of first selection transistors or the first at least two of the plurality of the second selection transistors of the first memory string;
    a second string selection line connected to the second one of the plurality of first selection transistors or the second at least two of the plurality of second selection transistors of the second memory string; and
    a common bit line commonly connecting ends of each of the first memory string and the second memory string.

2. The nonvolatile memory device of claim 1, wherein the plurality of second selection transistors are configured such that two second selection transistors form one pair.

3. The nonvolatile memory device of claim 1, wherein ones of the plurality of first selection transistors and ones of the at least two of the plurality of second selection transistors are alternately arranged along the first and second string selection lines.

4. The nonvolatile memory device of claim 1, wherein the first and second string selection lines are arranged in different rows.

5. The nonvolatile memory device of claim 1, wherein each of the first and second memory strings further comprises a plurality of unit elements that are connected in series.

6. The nonvolatile memory device of claim 5, wherein each of the plurality of unit elements comprises a control gate and a charge storage layer.

7. The nonvolatile memory device of claim 6, wherein the charge storage layer comprises a charge trap layer or a floated conductive layer.

8. The nonvolatile memory device of claim 5, wherein the plurality of unit elements are arranged in a NAND configuration.

9. A nonvolatile memory device having a common bit line structure, the nonvolatile memory device comprising:
    a first memory string comprising a first selection transistor having a first driving voltage, a plurality of second selection transistors connected in series to the first selection transistor and having a second driving voltage that is lower than the first driving voltage, and a plurality of unit elements each comprising a control gate and a charge storage layer;
    a second memory string comprising a third selection transistor having the first driving voltage, a plurality of fourth selection transistors connected in series to the third selection transistor and having the second driving voltage, and the plurality of unit elements each comprising the control gate and the charge storage layer;
    a plurality of word lines respectively connected to control gates of the plurality of unit elements of the first and second memory strings which are arranged in the same rows, and crossing the first and second memory strings;
    a first string selection line connected to one of the first selection transistors and the plurality of the second selection transistors of the first memory string, and crossing the first memory string;
    a second string selection line connected to one of the third selection transistors and the plurality of the and fourth selection transistors of the second memory string, and crossing the second memory string; and
    a common bit line commonly connecting ends of each of the first memory string and the second memory string.

10. The nonvolatile memory device of claim 9, wherein the second selection transistors are configured such that two second selection transistors form one pair and wherein the fourth selection transistors are configured such that two fourth selection transistors form one pair.

11. The nonvolatile memory device of claim 9, wherein the first and second selection transistors are alternately arranged along the first and second string selection lines and wherein the third and fourth selection transistors are alternately arranged along the first and second string selection lines.

12. The nonvolatile memory device of claim 9, wherein the first and second string selection lines are arranged in different rows.

13. The nonvolatile memory device of claim 9, wherein the charge storage layer comprises a charge trap layer or a floated conductive layer.

14. The nonvolatile memory device of claim 9, wherein the plurality of unit elements are arranged in a NAND configuration.

15. A nonvolatile memory device having a common bit line structure, the nonvolatile memory device comprising;
   a plurality of unit elements having a NAND cell array structure, arranged in each of a plurality of memory strings, and each comprising a control gate and a charge storage layer;
   a plurality of common bit lines each commonly connected to ends of each of one pair of memory strings among the plurality of memory strings;
   a first selection transistor having a first driving voltage and a plurality of second selection transistors connected in series to the first selection transistors and having a second driving voltage that is lower than the first driving voltage, wherein the first selection transistor and the plurality of the second selection transistors are arranged between the common bit lines and the unit elements of the plurality of memory strings;
   a first string selection line connected to one of the first selection transistors and the plurality of the second selection transistors of a first memory string of one pair of memory strings connected to one of the plurality of common bit lines;
   a second string selection line connected to one of the first selection transistors and the plurality of the second selection transistors of a second memory string of one pair of memory strings connected to one of the plurality of common bit lines; and
   a plurality of word lines connected to control gates of the unit elements having the NAND cell array structure which are arranged in the same rows.

16. The nonvolatile memory device of claim 15, wherein the first and second selection transistors included in one pair of memory strings connected to one of the plurality of common bit lines are alternately arranged along the first and second string selection lines.

17. The nonvolatile memory device of claim 15, wherein the first and second selection transistors included in one pair of memory strings connected to one of the plurality of common bit lines are arranged to be respectively symmetric with respect to the first and second selection transistors included in another pair of memory strings connected to an adjacent common bit line.

18. The nonvolatile memory device of claim 15, wherein the first and second selection transistors are alternately arranged along the first and second string selection lines.

19. The nonvolatile memory device of claim 15, wherein the first and second string selection lines are arranged in different rows.

20. The nonvolatile memory device of claim 15, wherein the charge storage layer comprises a charge trap layer or a floated conductive layer.

\* \* \* \* \*